April 29, 1969 M. GREEN 3,441,449

THERMOELECTRIC SYSTEM

Filed Dec. 13, 1966

INVENTOR.
MILTON GREEN

BY Ernest J. Weinberger
Louis B. Applebaum
ATTORNEYS

United States Patent Office 3,441,449

Patented Apr. 29, 1969

3,441,449

THERMOELECTRIC SYSTEM

Milton Green, 980 Flanders Road,
Mystic, Conn. 06355

Filed Dec. 13, 1966, Ser. No. 601,830
Int. Cl. F25b *21/02;* H01v *1/30, 1/28*
U.S. Cl. 136—203 7 Claims

ABSTRACT OF THE DISCLOSURE

A thermoelectric system having a heat absorbing junction, a heat discharging junction, and ohmic isolation junctions adapted to isolate the heat absorbing region from the heat discharging region.

Figure 1:
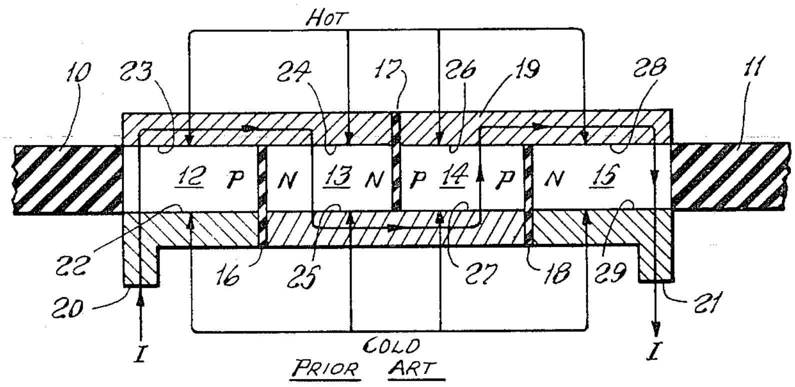

The invention described herein may be manufactured and used by or for the Government of the United States of America for governmental purposes without the payment of any royalties thereon or therefor.

This invention relates in general to thermoelectric devices and more particularly to Peltier couples for the transfer of heat therebetween and the improvement of the efficiency thereof.

Basically the operation of thermoelectric devices depends upon two well-known effects. The Peltier effect deals with two dissimilar conductors (electrical) joined in a circuit wherein direct current is passed therethrough. At one junction heat is generated while at the other heat is absorbed (cooling). The opposite effect or Seedbeck effect, contemplates the generation of direct current in the circuit by maintaining the junctions at different temperatures.

Since the discovery of these two phenomenon, extensive efforts have been made to simplify and to improve the economy, efficiency and operating parameters thereof in order to provide a practical and useful device which would in some respects be competitive with existing vapor phase mechanical systems. It should be noted that until recently the practical application of these effects was not within the realm of possibility. The recent advent of semiconductors has made available materials whose Peltier and Seebeck coefficients are far greater than the pure conductors employed in the laboratory.

Use of semiconductors having greatly magnified thermoelectric effects permits, to some extent, a practical application of these effects for present usage. Additionally, these semiconductor materials should exhibit the property of poor thermal conductivity or a high thermal insulation. One basic requisite is that the thermocouple or junction, for semiconductors, be of two materials, one of the negative or N type and the other positive or P type. In order to satisfy this requirement, the semiconductors, during manufacture, are provided with an impurity atom which supplies electrons to saturate the covalent chemical structure and this atom is generally termed a donor impurity. The ensuing material is called N type due to the fact its conductivity is basically of electrons. On the other hand, by providing an impurity atom which contributes insufficient electrons to complete the binding structure, the resulting material is of a P type. This is also called an acceptor impurity because the basic conduction is carried by positive holes.

A number of suitable semiconductors have recently been developed which include lead telluride, lead selenide, antimony telluride and bismuth telluride. These materials are all suitable for providing positive thermocouple elements while the lead and bismuth telluride can also be made into negative elements. Additionally, other positive types of germanium, silicon, indium and antimony may be used with the above-mentioned negative types to provide operable thermocouples.

Present methods for heating, refrigerating and generating electrical energy generally include the use of some mechanical powered system. These systems are in the main bulky, subject to wear, and require periodic maintenance. Thermoelectric devices overcome these deficiencies but introduce other inherent drawbacks in addition to the fact that they are still in the development stage. Due to their inefficiency and high cost of production, thermoelectric devices cannot as yet compete, on an equal level, with the aforementioned mechanical systems although they are used for special purposes where they have a necessary or advantageous property.

In view of the foregoing, it is an object of this invention to provide a simple, reliable, efficient and inexpensive improved thermoelectric system.

Another object of my invention is to provide a thermoelectric structure suitable for commercial manufacture and which exhibits a greater thermoelectric efficiency than has heretofore been available.

Other objects and advantages will appear from the following description of an example of the invention, and the novel features will be particularly pointed out in the appended claims.

Figure 2:
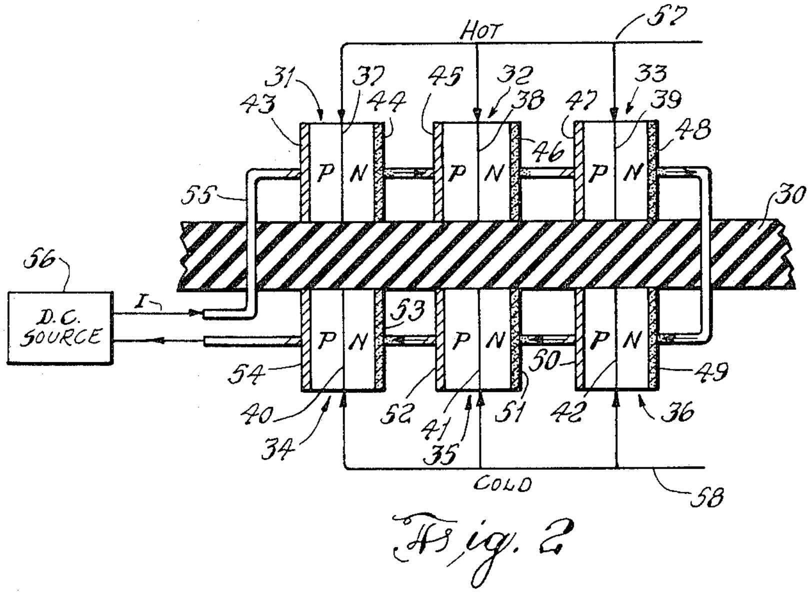

In the accompanying drawings:

FIG. 1 is a cross-section view of a conventional thermoelectric system structure; and FIG. 2 is a cross-section view of an embodiment of a thermoelectric system made in accordance with the principles of this invention.

In the embodiment of a typical thermoelectric structure illustrated in FIG. 1, which represents the prior art, a plurality of semiconductors of both P and N type are disposed proximate one another with an interposed insulator therebetween. Although a fixed number of these semiconductors are shown, it is customary to employ a number thereof sufficient to provide the necessary thermoelectric energy. The entire structure may be supported and insulated in a variety of ways, as for example, by oppositely extending portions 10 and 11 of material which is a good thermal as well as an electrical insulator. The semiconductor thermoelectric elements (12, 13, 14, 15) are arranged serially in alternating types with insulating portions 16, 17 and 18 interposed therebetween. Disposed about these thermoelectric elements and in contact with the outer peripheral surfaces thereof is a sectioned electrical conductor 19, as for example, copper. The insulating portions (16–18) are provided with extending ends which also serve to divide the conductor 19 so that the current passing therethrough is made to follow a particular circuit path through the thermoelectric elements. This electrical conductor is also an excellent thermal conductor so that proper heat transfer can be effected.

The thermal characteristic of the P type element is such that the junction into which the current flows absorbs heat and becomes the cold junction while the junction thereof out of which the current flows acts as a source of heat and is the hot junction. The exact opposite situation exists for the N type thermoelectric element. Bearing this characteristic in mind, a source of D.C. electrical energy (not shown) is connected across the structure so as to provide an incoming current I at point 20 and which thereafter exits at 21. The current initially enters P element 12 through the junction 21 between the conductor 19 and the element so as to provide a cold junction. This current leaves element 12 at junction 23 which then becomes the hot junction. The next junction encountered, namely 24, is a hot junction since the current is entering an N element. Continuing a similar analysis, it is clear that the upper junctions 23, 24, 26 and 28 are all hot junctions while the lower ones 22, 25, 27, and 29 constitute the cold junctions. Since the copper conductor 19 is a good thermal conductor, the lower portion thereof acts as a coolant surface while the upper portion liberates heat. These portions are effectively thermally separated by an insulating wall 10, 11 or by any other suitable arrangement.

Considering the embodiment of FIG. 1 as a conventional thermoelectric cooler, the junction between the metallic conductor 19 and the P and N semiconductor elements are the ones involved in the heating and cooling process. Since heat is evolved and absorbed at the junctions they are not ohmic, a term to be explained and defined hereinafter. This thermal phenomena takes place for current flowing in the direction indicated. If the current flow direction is reversed, then the heating and cooling junctions are reversed. The inherent disadvantage of this system is that the junctions themselves are separated solely by the semiconductor material which is not an excellent thermal insulator. Under these conditions, it is quite apparent that a considerable transfer of thermal energy takes place between the hot and cold junctions, thus lowering the efficiency of the entire system.

In the illustrated embodiment of FIG. 2 the hot and cold junctions are separated directly by a thermal and electrical insulator 30 with the heat liberating junctions and heat absorbing junctions disposed on opposite sides thereof. The junctions (thermoelectric) are at the interfaces of the P and N elements so that the thermoelectric structure can be defined as a P-N junction. Three of these structures, 31, 32, and 33, are disposed on one side of insulator 30 and the other three, 34, 35 and 36, on the other side. The junctions which are thermoelectric are designated at 37–42. The faces or peripheral surfaces of the elements through which the current will travel are coated or joined to another material so as to form an ohmic contact with the semiconductor material. Such a contact is one at which no or very little thermoelectric action takes place. That is, no heat is liberated thereat. Since this material is directly in the electrical path it should also provide good electrical conduction. These ohmic elements 43–54 are bonded to, adjacent or a part of the semiconductor elements and are of two distinct types depending on and with which type of material they form a junction. Generally, the basic material is a metal and preferably a noble metal. This metal is doped with a trace amount of the same doping material used to dope the semiconductor with which it is in contact. Ohmic elements 43, 45, 47, 50, 52 and 54 (P junctions) are those doped with a P type trace material or acceptor while the other have a trace of N type or donor material. The trace elements are only incorporated in the vicinities of the actual junctions. Since the wire 55 interconnects all the elements and forms a junction with the ohmic material, it is preferable to use wire of the same ohmic material. It need only be doped, however, quite near the actual point of contact. The trace elements will only be incorporated in the vicinities of the junctions and at some distance therefrom there will be no doping trace impurity.

One satisfactory ohmic junction is attained by doping a gold wire with a trace of antimony which provides a good ohmic contact junction for N type materials such as germanium and silicon. By doping the gold wire with indium, a good ohmic contact junction for P type germanium and silicon is provided. Superior thermoelectric elements such as bismuth telluride and zinc telluride can be similarly provided with good ohmic contacts.

D.C. source 56 is connected to doped ohmic wire 55 which in turn is in contact with similar ohmic material 43. Without this ohmic material, this junction would absorb heat to form a cold junction while similarly the junction at material 44 would be a cold junction. A similar analysis applies to the upper elements 31, 32 and 33. The junction between these P and N type elements is a hot junction so that the upper thermoelectric elements, when joined as shown, are heat liberators. In this case, with the current flow direction as shown, the current leaves the P type and enters the N type. Conversely, the active junctions for the lower thermoelectric elements 34, 35 and 36, the interface junctions 40, 41 and 42 form heat absorbing or cold junctions without any heat transfer taking place at their outer wall junctions. The interface junctions are employed directly in the heat exchange or means as represented at 57 and 58 which are well known in the art are used to provide distant exchange.

It should be observed that each thermoelectric element has an active junction between the two semiconductor material types and a pair of ohmic junction which thermally isolate the junctions to minimize any heat transfer therebetween. This isolation property within the junctions provides an efficient thermoelectric device or system.

It will be understood that various changes in the details, materials, and arrangements of parts (and steps), which have been herein described and illustrated in order to explain the nature of the invention, may be made by those skilled in the art within the principle and scope of the invention as expressed in the appended claims.

I claim:

1. An improved thermoelectric device comprising:
   - a plurality of thermocouples each comprising a P and N semiconductor mass with an intimate electrical junction contact therebetween,
   - a support member of an electrically and thermally insulating material carrying said thermocouples in spaced apart relation,
   - a first ohmic contact surface of a first material covering each of said P masses opposite said junction contact,
   - a second ohmic contact surface of a second material covering each of said N masses opposite said intimate contact and electrically separated from said first ohmic contact surface, ohmic electrical conducting means connecting said ohmic contact surfaces of said first material to contact surface of said second material to form an open series loop whereby when direct current is applied in one direction across said open loop, said junction contacts will form thermal heat exchange junctions and the thermocouples on one side of said support member will liberate heat while those on the other side will absorb heat.

2. The thermoelectric device according to claim 1, wherein said first ohmic contact surface is of a noble metal having dispersed therein by doping, a trace of the same material employed to dope said P semiconductor.

3. The thermoelectric device according to claim 2, wherein said second ohmic contact surface is of a noble metal having dispersed therein by doping, a trace of the same material employed to dope said N semiconductor.

4. The thermoelectric device according to claim 1, wherein said first ohmic contact surface is of gold having doped therein a trace of indium and said second ohmic contact surface is of gold having doped therein a trace of antimony.

5. The thermoelectric device of claim 4, wherein said P and N semiconductors are chosen from the group consisting of bismuth telluride and zinc telluride.

6. The thermoelectric device of claim 5, wherein said electrical conducting means is of a noble metal and that portion thereof proximate said first ohmic contact surface is doped with indium and that portion thereof proximate said second ohmic contact surface is doped with antimony.

7. The thermoelectric device according to claim 6, wherein said noble metal is gold.

References Cited

UNITED STATES PATENTS

| | | | |
|---|---|---|---|
| 2,919,553 | 1/1960 | Fritts | 136—204 X |
| 2,992,549 | 7/1961 | Curtis | 62—3 |
| 2,993,340 | 7/1961 | Sheckler | 62—3 |
| 3,124,936 | 3/1964 | Melehy | 136—203 X |
| 3,136,134 | 6/1964 | Smith | 136—203 X |

ALLEN B. CURTIS, *Primary Examiner.*

U.S. Cl. X.R.

62—3; 136—212, 211